United States Patent [19]
Tapper et al.

[11] Patent Number: 5,789,257
[45] Date of Patent: Aug. 4, 1998

[54] METHOD AND APPARATUS FOR MEASURING SAMPLES AND FOR LOCALIZING A FIRST SUBSTANCE WITHIN A SURROUNDING SECOND SUBSTANCE BY MEANS OF NUCLEAR MAGNETIC RESONANCE

[75] Inventors: Ulf Anders Staffan Tapper, Johannesburg, South Africa; Detlef R. Mueller, Malsch, Germany; Grant Lysle High, Johannesburg; George William Over, Boksburg, both of South Africa; Peter Hoefer, Karlsruhe, Germany

[73] Assignee: Bruker Analytische Messtechnik GmbH, Rheinstetten-Forchheim, Germany

[21] Appl. No.: 585,835

[22] Filed: Jan. 11, 1996

[30] Foreign Application Priority Data

Jan. 13, 1995 [ZA] South Africa ................ 95/0253
Jan. 20, 1995 [ZA] South Africa ................ 95/0468

[51] Int. Cl.⁶ .................... G01N 24/08; G01N 24/10; G01N 33/00; G01V 3/00
[52] U.S. Cl. .................... 436/173; 436/145; 436/182; 324/300
[58] Field of Search .................... 436/173, 145, 436/182; 324/300

[56] References Cited

FOREIGN PATENT DOCUMENTS 277745  8/1988  European Pat. Off.
2285506 6/1995 United Kingdom.

OTHER PUBLICATIONS

G. Schauer et al. *J. Phys. E: Sci. Instrum.* 1987, 20, 43–46.
D.J Lurie et al. *Appl. Magn. Reson.* 1992, 3,917–925.
B. Yang et al. *Appl. Magn. Reson.* 1995, 9, 379–388.
A.A. Zhdanov *Soviet Phys.–Solid state* 1972, 14,649–654.
G. Datta et al. *Technology* 1973, 10, 66–68.
M. Stoher et al. *J. Chem. Phys.* 1977, 67, 3729–3738.
C.O. Anderson et al. *Aust. Gemmol.* 1981, 14, 87–89.
R.A. Wind et al. *Bull. Magn. Reson.* 1983, 5, 114–117.
M.J. Duijvestijn et al. *Chem. Phys. Lett,* 1983, 102, 25–28.
R.B. Jones et al. *Fuel,* 1986, 65, 520–525.
W. Sobol et al. *Solid State Commun,* 1986, 57, 933–935.
H.D. Roth et al. *J. Phys. Chem.* 1989, 93, 5697–5701.
H. Lock et al. *J. Mater. Res.* 1992, 7,2791–2797.
H. Lock et al. *J. Chem. Phys.* 1992, 99, 3363–3373.
M. Pruski et al. *Phys. Rev. B* 1994, 49, 10635–10642.
T. Kotaki et al. *Denki Kagaku oyobi Kogyo Butsuri Kagaku* 1994, 62, 495–503.
J. Zhou et al. *Solid State Nucl. Magn. Reson.* 1994, 3, 39–351.
H.C Dorn et al.: "The Flow Transfer of a Bolus with ¹H Dynamic Nuclear Polarization From low To High Magnetic Fields"; *Chemical Physics Letters,* vol. 155 No. 2, pp. 227–232 (1989).
"Nuclear Spin–Lattice Relaxation via Paramagnetic Centers in Solids. $^{13}$C NMR of Diamonds" by Henrichs, P.M., et al., *Journal of Magnetic Resonance,* vol. 58, pp. 85–94. Academic Press, Inc. (1984).

(List continued on next page.)

*Primary Examiner*—Arlen Soderquist
*Attorney, Agent, or Firm*—Claude A. S. Hamrick; Oppenheimer W Donnelly

[57] ABSTRACT

A method and an apparatus are disclosed for detecting a first substance within a second substance, preferably for localizing diamonds in kimberlite rocks. The first substance, e.g. the diamonds, have a very long spin-lattice relaxation time ($T_1$) in the order of hours. For rapidly detecting the first substance, the build-up of magnetization of a predetermined kind of nuclei, e.g. $^{13}$C, being abundant in the first substance only is shortened and the nuclear magnetic resonance of that kind of nuclei is measured thereafter. The shortening is executed within a pre-treatment station, whereas the measurement takes place within an analyzing station. The shortening and the measuring, respectively, are carried out within magnetic fields ($B_{01}$, $B_{02}$) of different field strengths.

22 Claims, 2 Drawing Sheets

OTHER PUBLICATIONS

"Electron Spin Resonance in the Study of Diamond" by Loubser, J. et al., *Rep. Prog. Phys.* vol. 41, pp. 1201–1248, The Institute of Physics (1978).

"Applicatins of Dynamic Nuclear Polarization in $^{13}$C NMR in Solids" by Wind, R.A., et al., *Progress in NMR Spectroscopy*, vol. 17, pp. 33–67, Pergamon Press Ltd. (1985).

"Observation of $^{13}$C NMR Signal of Diamonds in Kimberlites" by Kriger, J., et al., *Abstract of the Colloques Ampere*, pp. 808–809, Kazan (1994).

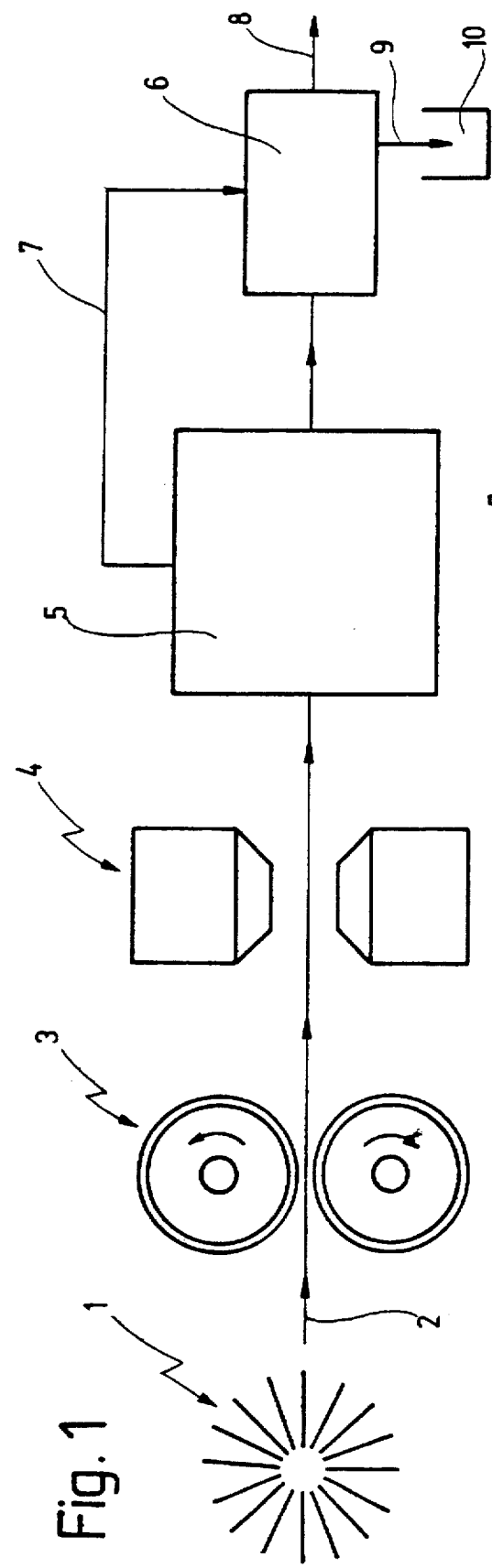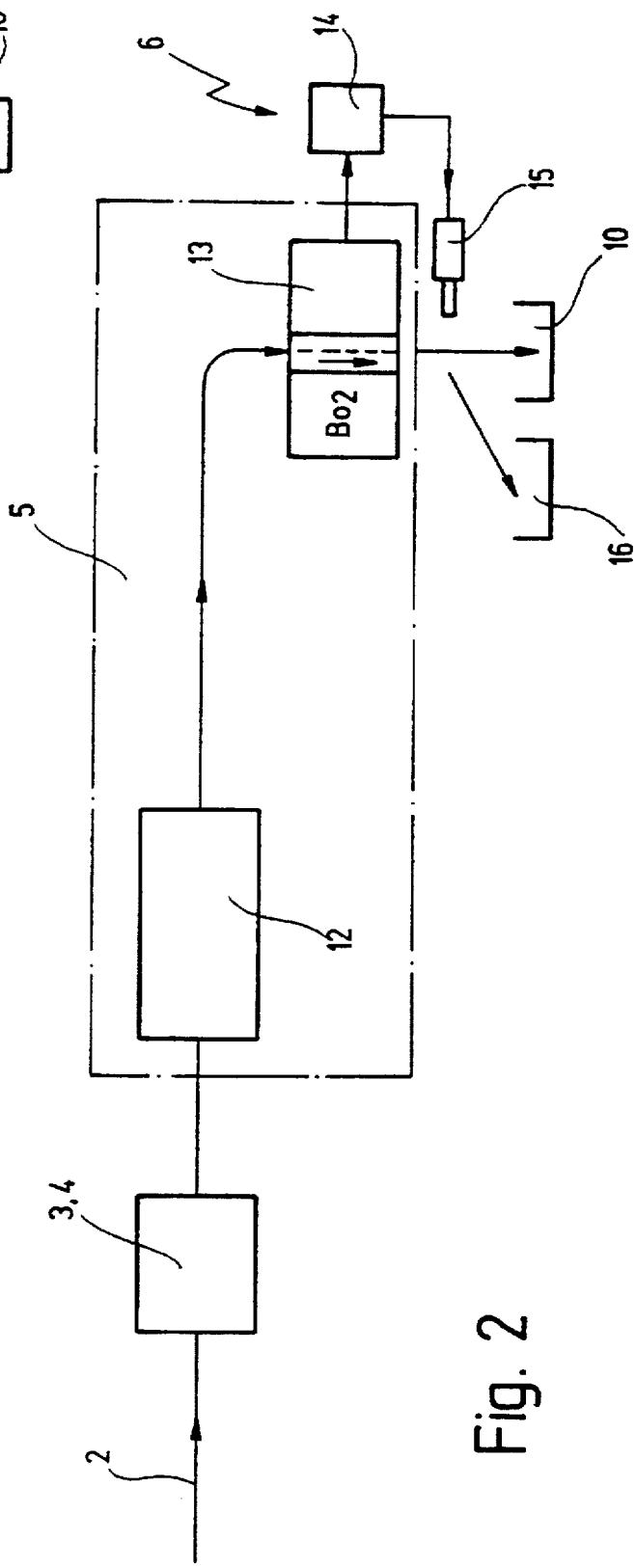

METHOD AND APPARATUS FOR MEASURING SAMPLES AND FOR LOCALIZING A FIRST SUBSTANCE WITHIN A SURROUNDING SECOND SUBSTANCE BY MEANS OF NUCLEAR MAGNETIC RESONANCE

FIELD OF THE INVENTION

The present invention relates generally to a method and an apparatus of measuring or detecting specific substances by means of nuclear magnetic resonance. The preferred field of application is the detection of diamonds within host rock material.

Specifically, the invention relates to a method of detecting a first substance within a second substance surrounding the first substance, by means of nuclear magnetic resonance (NMR), the first substance having a very long spin-lattice relaxation time $T_1$ of at least ten seconds, preferably one minute, in particular of far more than ten minutes or even many hours.

Still more specifically, the invention, further, relates to a method of measuring samples by means of nuclear magnetic resonance (NMR), the sample having a very long spin-lattice relaxation time $T_1$ of at least ten seconds, preferably one minute, in particular of far more than ten minutes or even many hours, the relaxation time being reduced for increasing the measuring signal.

Still more specifically, the invention further relates to a method of detecting a first substance within a second substance surrounding the first substance, by means of nuclear magnetic resonance (NMR), a sample comprising both substances being exposed sequentially to two magnetic fields, the nuclear magnetic resonance being measured at least during exposure of the sample to one of the magnetic fields.

The invention further relates to an apparatus for detecting a first substance within a second substance surrounding the first substance, by means of nuclear magnetic resonance (NMR), the first substance having a very long spin-lattice relaxation time of at least ten seconds, preferably one minute, in particular of far more than ten minutes or even many hours.

More specifically, the invention further relates to an apparatus for measuring samples by means of nuclear magnetic resonance (NMR), the samples having a very long spin-lattice relaxation time of at least ten seconds, preferably one minute, in particular of far more than ten minutes or even many hours, the relaxation time being reduced for increasing the measuring signal.

Still more specifically, the invention further relates to an apparatus for rapidly detecting a first substance within a second substance surrounding the first substance, by means of nuclear magnetic resonance (NMR), the apparatus comprising means for generating two magnetic fields, a sample containing the two substances being sequentially exposed to the two magnetic fields, the nuclear magnetic resonance being measured when the sample is exposed to at least one of the magnetic fields.

BACKGROUND OF THE INVENTION

Nuclear magnetic resonance is a well-known spectroscopic method allowing to detect the presence of certain kind of nuclei having a spin or a magnetic moment. NMR is mostly used for analyzing organic liquids in which $^1H$ nuclei (protons) have a magnetic moment resulting in resonance absorption. NMR is, further, used in a wide range for detecting other kinds of nuclei, for example $^{13}C$, $^{14}N$, $^{17}O$, and others.

It is well-known that the overall measuring time for NMR-measurements depends on the spin-lattice relaxation time, the so-called longitudinal relaxation time $T_1$. This interrelation is based on the fact that the relaxtion time $T_1$ is a measure for the build-up and decay, respectively, of nuclear magnetization generating the detectible measuring quantity within an NMR-measurement.

In solids, the relaxation time $T_1$ is mostly much longer than that of liquids. In certain crystals, the relaxation time $T_1$ is in the order of several minutes or hours or even days. Conventional NMR-measurements may, therefore, only be executed if the measuring time is in the order of magnitude of the relaxation time $T_1$. This measuring time is again multiplied correspondingly when averaging methods are used for enhancing the signal-to-noise ratio by accumulating a certain number of measurements and then processing their average value.

One example for a sample material having an extremely long spin-lattice relaxation time $T_1$ is diamond. Diamonds are basically adapted to make NMR-measurements thereon, because they contain $^{13}C$ nuclei. The $^{13}C$-contents within natural diamonds is relatively low. The natural abundance of $^{13}C$ in carbon is in the order of 1.1%. Diamonds are one modification of carbon and also comprise $^{13}C$ in that order of magnitude. Due to this concentration of $^{13}C$ within natural diamonds, NMR-measurements may be used for localizing or detecting such diamonds, because $^{13}C$ gives rise to characteristic absorption signals.

Within a measuring magnetic field strength in the order of 11T, one obtains a value for $T_1$ of more than 450 hours. Therefore, when using conventional measuring methods, NMR-measurements of $^{13}C$ in diamonds may only be executed when spending extreme amounts of time.

An NMR-measurement on diamonds of the aforementioned kind is described in the article "Nuclear Spin-Lattice Relaxation Via Paramagnetic Centers in Solids. $^{13}C$ NMR of Diamonds" by Henrichs, P. M. et al., Journal of Magnetic Resonance, 58, pp. 85–94 (1984). For carrying out this experiment, the diamond sample was arranged within the magnets for three and a half days. It was observed during these experiments that the spin-lattice relaxation time $T_1$ of artificial diamonds was in the order of one hour, whereas the corresponding relaxation time of natural diamonds could not be measured, since it was in excess of 48 hours. The resulting spectrum consists of a single line being offset from the reference substance TMS (Tetramethylsilan) with a chemical shift of about 39 ppm. The measurements described in the article are related to artificial diamonds, therefore, the obtained measurements may not directly apply to natural sample material.

Diamonds, moreover, are a kind of sample material on which electron spin resonance (ESR) measurements may be made due to the typical N-defects within the crystalline lattice. ESR-studies on diamonds are described in the article "Electron Spin Resonance in the Study of Diamond" of Loubser, J. et al., Rep. Prog. Phys., 41, 1978, pp. 1201–1248.

From the article "APPLICATIONS OF DYNAMIC NUCLEAR POLARIZATION IN $^{13}C$ NMR IN SOLIDS", R. A. Wind et al., Progress in NMR Spectroscopy, Vol. 17, pp. 33–67, 1985, Pergamon Press Ltd., it is known to enhance NMR signals from solid samples by generating the NMR excitation together with a second excitation at or near the electron resonance frequency. This method is identified as dynamic nuclear polarization (DNP). The NMR signal enhancement is effected by increasing the magnetization of the $^{13}C$ nuclei by simultaneously exciting electron spin resonance.

The article describes an experiment during which comparative measurements were carried out on natural diamonds on the one hand and artificial industrial diamonds on the other hand. For that purpose, the respective samples were arranged within a constant, homogeneous magnetic field of 1.4T field strength. The proton resonance frequency then is 60 MHz and the resonance frequency for $^{13}C$ nuclei is 15 MHz. The electron spin resonance frequency at this magnetic field strength is in the order of 40 GHz.

Bearing in mind the fact that the spin-lattice relaxation time $T_1$ of diamonds is extremely long, namely in the order of hours, a conventional measurement of $^{13}C$ nuclei alone would be extremely time-consuming without the DNP signal enhancement. When using the DNP technique, the signal enhancement may be in the order of a factor of between 10 and 2.000 and, therefore, natural diamonds and industrial diamonds may be measured within a relatively short period of time. Further to the signal enhancement, another benefit from the DNP method consists in that the magnetization build-up rate is very much faster as compared with the $T_1$ relaxation time of diamonds.

In the nature, diamonds are primarily to be found within rocks as are identified with the collective denomination kimberlite. To a lesser extent, diamonds are also found in lamproite rocks. This denomination identifies a group of rocks having mostly a dull greenish-grey to bluish colour, are rich in volatile components and are potassium-oriented ultrabasic magmatic rocks coming as ledges or flat lodes or as fillings of deep volcanic pipes. Kimberlite may contain diamonds as one component. The most important examples are the kimberlite breccias of the diatremes in South Africa, Western Australia, Brazil, and India (c.f. Dawson, D., "Kimberliths and their Xenoliths", Springer, 1980).

Kimberlite rock, too, contains carbon, however predominantly as carbonates ($CO_3$-groups). The relative portion of carbon within kimberlite is, however, relatively low, i.e. below 3%. Due to the high chemical anisotropy, the corresponding NMR line is broadened to an extent that it does not interfere when NMR-measurements on other lines are conducted.

From the article "Observation of $^{13}C$ NMR Signal of Diamonds in Kimberlits" of Kriger, J. et al., Abstract of the Colloque Ampere, Kazan (1994), pp. 808–809, it is known to conduct $^{13}C$ NMR-measurements for detecting diamonds in surrounding kimberlite rocks. In the experiment described, the residual time of samples within the magnet was about 30 minutes. By making comparative measurements between first samples containing only kimberlite rocks and second samples containing kimberlite rocks and diamonds, it was observed that the $^{13}C$ NMR-signals were significantly different in amplitude.

Conventionally, for producing diamonds complex mining and detecting methods are used. Typically, by means of blasting the rock is first broken within the diamond mine well into fragments having a size of about 400 mm. Within the well there is a first rock-breaking mill, milling these fragments into smaller fragments having an average size of between 130 and 200 mm. The rocks so milled are then conveyed to the earth's surface and then run through a first detecting station in which the gravels are exposed to an X-ray fluorescence irradiation. The irradiation effects that the diamonds that are located at the surface of the gravels may be detected due to their fluorescence. The gravels are then conveyed to a second rock-breaking mill and, if need be, to further rock-breaking mills, each followed by a corresponding X-ray fluorescence-measuring station or a density sorting station.

However, when doing so, only those diamonds may be detected that are located on the surface of the respective rock fragments or gravels. Expert estimations on the question which percentage of the real diamond contents is not found within the broken rocks and, hence, is lost with the waste, vary between 30% and 70%.

A further problem of this conventional methods is that during subsequent rock-milling processes big diamonds that are located within the rock fragments are broken. According to expert estimations, diamonds in the order of 20% are, thus, destroyed.

It goes without saying that considerable economical losses are generated when diamonds are not detected at all or when bigger and, hence, commercially viable diamonds are broken into smaller diamond fragments.

German patent specification 29 34 966 describes a method and an apparatus for detecting a chemical compound consisting of at least two chemical elements by means of magnetic resonance. This prior art method is related particularly to the detection of explosives in a predetermined surrounding, for example within pieces of luggage, and the like.

However, this prior art method is restricted to substances containing a kind of nuclei exhibiting a quadrupole moment. This is, for example, the case for $^{14}N$ nuclei which can be found in most explosives. However, no nuclei exhibiting quadrupole moments in significant concentration may be found in diamonds so that this prior art method may not be used for detecting diamonds.

SUMMARY OF THE INVENTION

It is, therefore, an object underlying the invention to further improve a method and an apparatus of the kind mentioned at the outset so that rapid measurements are rendered possible on such substances having a very long spin-lattice relaxation time $T_1$ so that it becomes possible to detect and localize gemstones, in particular diamonds within surrounding rocks by means of rapid measurements.

According to the first method specified at the outset, this object is achieved in that for rapidly detecting the first substance, the build-up of magnetization of a kind of nuclei being abundant in the first substance only is shortened and that the nuclear magnetic resonance of that kind of nuclei is measured thereafter.

According to the second method specified at the outset, the object is achieved in that the sample is pre-polarized and excited in a first magnetic field such that the build-up of magnetization of a predetermined kind of nuclei is shortened and that the nuclear magnetic resonance of that kind of nuclei is measured in a second magnetic field, the magnetic fields having different field strengths.

According to the third method, specified at the outset, the object is achieved in that for a sample, in which only the first substance has a very long spin-lattice relaxation time $T_1$ of at least ten seconds, preferably one minute, in particular of far more than ten minutes, the build-up of magnetization of a kind of nuclei being abundant in the first substance only is shortened within the first magnetic field and that the nuclear magnetic resonance of that kind of nuclei is measured within the second magnetic field, the magnetic fields having different field strengths.

According to the apparatus mentioned first at the outset, the object is achieved in that for rapidly detecting the first substance, a pre-treatment station is provided in which the build-up of magnetization of a first kind of nuclei being abundant in the first substance only is shortened, and that an analyzing station is provided in which the nuclear magnetic resonance of that kind of nuclei is measured.

According to the apparatus mentioned second at the outset, the object is achieved in that a pre-treatment station is provided comprising a first magnetic field, in which the sample is excited, such that the build-up of magnetization of a predetermined kind of nuclei is shortened, and that an analyzing station is provided comprising a second magnetic field, in which the nuclear magnetic resonance of that kind of nuclei is measured, the magnetic fields having different field strengths.

Finally, the object is achieved by the apparatus mentioned third at the outset in that a pre-treatment station is provided in which the build-up of magnetization of a kind of nuclei being abundant in the first substance only is shortened within the first magnetic field, and that an analyzing station is provided for measuring the nuclear magnetic resonance of that kind of nuclei within the second magnetic field, the magnetic fields having different field strengths and only the first substance having a very long spin-lattice relaxation time of at least ten seconds, preferably one minute, in particular of far more than ten minutes.

The object underlying the invention is thus entirely achieved.

Considering, for example, a preferred embodiment of the invention, relating to measurements on diamonds, in particular within surrounding kimberlite rocks, it had been mentioned above that the spin-lattice relaxation time $T_1$ of diamonds may be in the order of 500 hours, because within the diamond crystal the energy density of lattice oscillations in the range of NMR frequencies is very low.

For shortening the build-up of magnetization of a predetermined kind of nuclei, several methods may be used:

First, it is possible to expose the sample material to an irradiation, in particular to an ionizing irradiation. The irradiation may be a γ-radiation, a neutron beam, X-ray irradiation or an irradiation with ultra-violet light. However, care must be taken, because such radiation may generate defects within the crystals which might have negative effects on the viability of gemstones.

A second method for shortening the build-up of magnetization consists in generating induced spin levels by means of ultrasonic irradiation. Preliminary experiments have shown that with a relatively low power of several mW at a quarter of the NMR resonance frequency a shortening by a factor of 10 may be obtained. In particular for measurements on single samples this embodiment should be taken into consideration.

The third and most preferred option is to use cross-polarization, in particular to shorten the build-up of magnetization of the predetermined kind of nuclei by means of electron spin resonance.

When doing so, one takes advantage of the fact that diamonds exhibit a relatively high electron magnetization due to the numerous paramagnetic centers within the crystal. This electron magnetization may be caused to build-up and to decay, respectively, with a time constant in the order of 1 ms by using appropriate methods. The electron magnetization that is built-up rapidly may then be transferred to the nuclei. This is possible, because the electrons and the nuclei are comprised in a common quantum system. In experiments using continuous wave operation, the magnetization transfer would be effected through spin diffusion with the time constant being between 20 min and 1 hour. If, however, pulse experiments are used according to the preferred embodiment of the invention, the transfer time between electron magnetization and nuclear magnetization is only in the order of several ms due to the absence of forbidden transitions.

When doing so, it is possible according to the invention to obtain an amplification of polarization by a factor of several 1.000, the theoretical limit being about 16.000 according to present knowledge.

ESR measurements are conducted at relatively high frequencies, typically at microwave frequencies. Therefore, one has to make considerations with respect to the appropriate magnetic field. If the NMR-measurement as such is conducted within a magnetic field of at least 4T field strength, this would result in a $^{13}C$ measurement frequency in the order of 40 MHz. Within such a magnetic field, the ESR resonance frequency, however, is about 100 GHz. The skin depth of such a microwave field in kimberlite is in the order of about 1 mm.

If, in contrast, the electron magnetization is caused to occur at a frequency of 2 GHz, the required field strength is only 80 mT. The skin depth of the microwave field in kimberlite is then about 10 cm corresponding approximately to half the gravel size of the samples.

The subsequent nuclear magnetic resonance of $^{13}C$ could be generated within the same magnetic field of 80 mT. This would correspond to an NMR measuring frequency of about 400 kHz. However, at such low NMR frequency, a very long deadtime would occur within the probe head and overall sensitivity would be poor.

Therefore, it is preferred to first generate the electron magnetization and to then further process the sample within a second magnetic field being preferably at a distant location. It is true that the magnetization will dephase during the transfer between the two locations, but it will be rephased within the second magnetic field with a time constant in the order of the transversal relaxation time $T_2$. For the subsequent NMR-measurement one has again the full magnetization minus that portion decaying with the relaxation time $T_{1D}$. This relaxation time $T_{1D}$ is in the order of several hours for natural diamonds.

It is preferred to use magnetic fields of different field strengths to generate a pre-polarization by means of ESR on the one hand and to execute the NMR-measurement as such on the other hand. It is further preferred when the second magnetic field is stronger than the first magnetic field. For, the relaxation time $T_1$ is generally proportional to the square of the field strength so that the time for building-up magnetization is shorter at lower field strength.

Although it would be possible to generate the different magnetic field strengths in one and the same magnet, by switching the field accordingly, it is preferred to spatially separate the two magnetic fields, i.e. to utilize two different magnet systems. One can, for example, use a resistive magnet system for pre-polarizing by means of ESR. In a magnetic field having a field strength of below 1T, the ESR resonance frequencies are in the order of several GHz. At these microwave frequencies, the microwave components may be designed with relatively large dimensions so that also larger samples and larger flowing masses of a continuous flow of sample material, respectively, may be pre-polarized.

In contrast, for the subsequent NMR-measurement one may utilize a superconducting magnet system in the order of 4T so that conventional technology may be used to conduct $^{13}C$ measurements in the order of 40 MHz.

The electron resonance may be excited with continuous wave signals or with pulse signals. Further, experiments with adiabatic passage may be made.

For the nuclear magnetic resonance measurement it is preferred to use a spin-echo pulse sequence comprising an excitation pulse and at least one subsequent refocusing pulse.

The detection may then be made via the intensity of the $^{13}C$ signal. Kimberlite contains very low amounts of carbon as carbonate which has no effect in so far. If, therefore, a $^{13}C$ signal is detected, there is a high likelihood for the presence of diamonds. The intensity of the $^{13}C$ signal is then indicative for the size of the diamonds comprised in the rock.

Considering now again the preferred field of application of the invention, namely the detection of diamonds in surrounding kimberlite rocks, several methods for processing the sample material may be used.

On the one hand, it is possible to measure a continuous flow of sample material.

This method has the advantage that within the operation of a diamond mine no discontinuous method steps are used. Instead, the extracted rock material having been broken down in a first step before may be processed continuously in a flow process.

On the other hand, one can use a discontinuous method in which predetermined sample quantities are individually measured.

This method has the advantage that for detecting diamonds in one of the predetermined sample quantities, one sample quantity of interest may easier be picked out.

In particular, the picked-out sample quantity may be divided into sub-quantities, and these sub-quantities may again be subjected to measuring processes so that it is possible to identify in a stepwise manner a very small portion of sample material in which the detected diamond must be located.

With all these methods it is advantageous to use nuclear magnetic resonance localizing or imaging measuring methods.

This measure has the advantage that it is not only possible to make a statement whether or not a diamond is present within a specific sample quantity. Instead, one can additionally make a statement where the sample is located within the sample quantity. In a one-dimensional measurement, for example, one can say for an elongate sample container at which longitutinal position the diamond is located. When multi-dimensional measurements are used, the diamond may still more precisely be located. It would then be possible with much less efforts to cautiously remove the diamond from the surrounding rocks without running the risk that the diamond is damaged or even destroyed when the surrounding rock is broken away. One can, for example, remove the surrounding rock except a certain layer around the diamond and then remove the diamond chemically from the remaining rock which would not be possible during a mass-processing of the entire rock material extracted from the mine.

Further advantages will become apparent from the description and the appending drawing.

It goes without saying that the features identified above and those that will be explained hereafter may not be used only in the respective combination but may further be used in other combinations or alone without departing from the scope of the present invention.

Embodiments of the invention are depicted in the drawing and will be explained in more detail in the description below.

IN THE DRAWINGS

FIG. 1 shows extremely schematically a flow diagram for explaining one embodiment of a process according to the invention.

FIG. 2 shows a somewhat more detailed schematic drawing for explaining the process and the apparatus according to the invention.

DETAILED DESCRIPTION OF THE PREFERRED EMBODIMENTS

Figure 3:
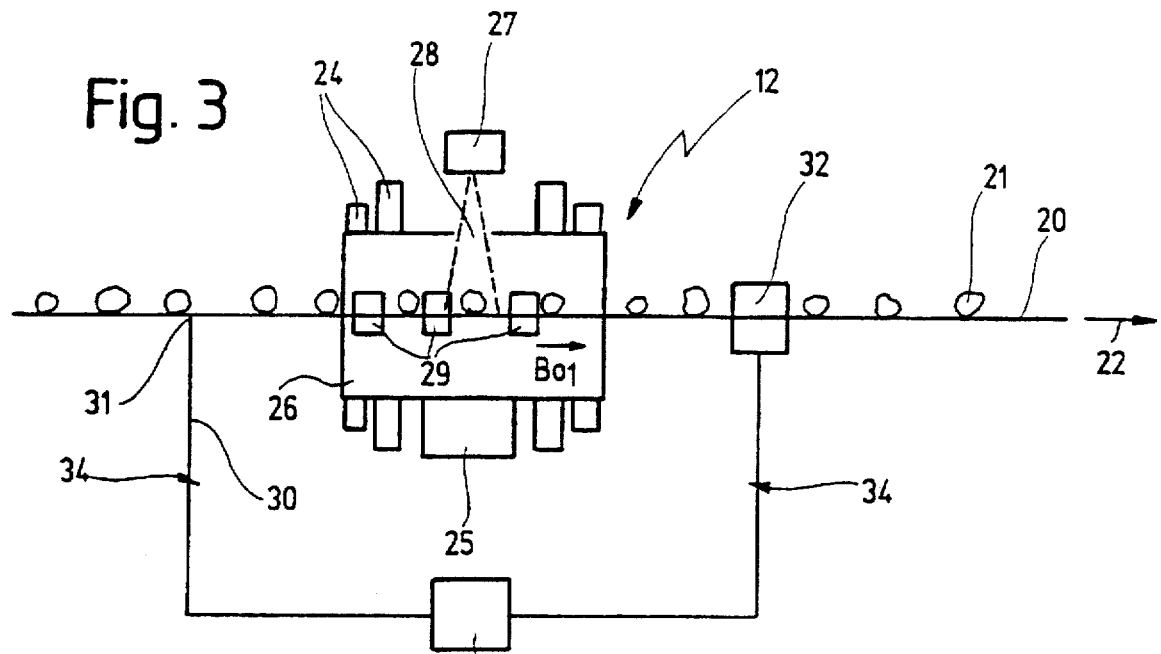
FIG. 3 shows a portion of FIG. 2 in more detail.

In FIG. 1 reference numeral 1 shall symbolize a blasting or an explosion made within a diamond mine well. The rocks that are blasted come as big fragments having a typical "grain size" in the order of 400 mm. These relatively big fragments are then conveyed away from the location of blasting along a conveyor path 2 to a first rock-breaking mill 3. First rock-breaking mill 3 mills the relatively big fragments so that a grain size of between 100 and 200 mm is generated. The conveyor rate is about 100 t per hour. The gravel milled by rock-breaking mill 3 is then conveyed through the operating range of a magnet 4. Magnet 4 has a strong magnetic field gradient and serves to remove ferromagnetic components from the conveyed material that might be dangerous for the subsequent measuring and processing stations.

The sample material is then conveyed along conveyor path 2 into the operating range of a measuring device 5, the details of which will be further described below. Measuring device 5 is adapted to make a statement whether or not a diamond is present within a predetermined sample quantity or within a predetermined area of a continuously flowing sample material flow. A subsequent separation device 6 is controlled by measuring device 5 via a control line 7. If a diamond was detected within a certain portion of sample material, separation device 6 directs that portion to a first output 8 from which on this viable portion of sample material will be further investigated. The remaining barren sample material being void of diamonds is, in contrast, directed to a second output 9 and will then be conveyed to a reject bin, depicted only schematically, or will be conveyed to a waste dump.

FIG. 2 shows further details of measuring device 5.

A pre-treatment station 12 is arranged at the input of measuring device 5, the pre-treatment station 12 being followed by an analyzing station 13. Analyzing station 13 comprises a nuclear magnetic resonance (NMR) measuring installation of conventional design. The NMR measuring installation may, for example, comprise a superconducting magnet having a field strength of about 4.7T so that the measuring installation will allow to conduct $^{13}C$ measurements at bout 50 MHz.

Analyzing station 13 controls a computer 14 which, in turn, activates a sample separator element 15. Sample separator element 15 may, for example, be a strong blower, directing the flow of sample material to reject bin 10 or to a diamond concentration bin 16, respectively, in which viable sample material containing diamonds is collected.

FIG. 3 shows further details of pre-treatment station 12.

Conveyor path 12 is configured as a belt conveyor within the operating range of pre-treatment station 12. Fragments 21 are conveyed on belt conveyor 20 in the direction of an arrow 22, i.e. from the left to the right in FIG. 3.

Fragments 21 on belt conveyor 20 are conveyed through a low-strength magnet installation 24 being, for example, a conventional resistive magnet system. Magnet installation 24 generates a homogeneous, pre-polarizing magnetic field having a field strength of e.g. 0.0857T with a homogeneity of $5\times10^{-4}$ within a volume of about 100.000 cm$^3$. Magnet installation 24 may, for example, be a water-cooled air-core coil in double Helmholtz-arrangement with a free bore of 700 mm diameter allowing access to the magnetic field center both in a radial and an axial direction.

Magnet installation 24 surrounds a microwave resonance system. The system comprises a microwave source 25 having an operating frequency of e.g. 3 GHz being coupled to a microwave resonator 26. The term resonator is to be understood as comprising any conceivable kind of microwave-resonant or non-resonant structures, i.e. hollow cavities, line resonators, waveguides, flares, etc.

As an alternative or additionally, a source 27 of ionizing radiation may be provided. In the depicted embodiment, the microwave resonator 26 is provided with a slot 28 for allowing ionizing irradiation to enter from source 27 into the interior of microwave resonator 26 and, thus, on the fragments 21 conveyed therethrough.

Additionally or as an alternative, ultrasonic transducers 29 may be provided for generating ultrasonic oscillations within the fragments 21 in the magnet installation 24.

For that purpose, a coupling medium is required helping to transfer ultrasonic oscillations into the fragments 21. An appropriate coupling medium would be silicon-based oil. In FIG. 3, reference numeral 30 indicates a circuit for circulating the coupling medium. At 31 coupling medium is brought into contact with fragments 21 prior to their coming into the field of operation of magnet installation 24 and microwave resonator 26, respectively. As soon as fragments 21 are conveyed out of that area, the coupling medium is removed therefrom in a coupling medium removal station 32. Due to the closed-loop circuit identified by arrows 34, the coupling medium is then recycled and may e.g. be pumped through the heat exchanger 33. By doing so, the coupling medium is pumped, cooled, and then fed back to the input at 31.

In certain cases it might not be mandatory to use a separate coupling medium. Instead, it would be sufficient to establish a physical contact between an appropriate ultrasonic transducer and the fragments 21. For example, one could use a flat transducer being pressed onto the fragments 21 by means of a piston-and-cylinder unit.

The apparatus according to FIGS. 2 and 3 operates as follows:

Pre-treatment station 12 has the purpose to influence the flowing sample material such that the build-up of magnetization of $^{13}C$ nuclei within the diamonds is shortened. By doing so, the measuring time shall be reduced to an acceptable value so that continuous or quasi-continuous measurements are made possible within a mine having an output of e.g. 1.000 t per hour.

The excitation required for shortening the build-up of magnetization may be effected in various ways:

According to a first option, the sample material, i.e. the fragments 21, are exposed to a first magnetic field having a first magnetic field strength $B_{01}$ within magnet installation 24. By simultaneously irradiating a microwave field by means of microwave source 25 within microwave resonator 26, the electron system is excited, the excitation being possible within a very short period of time of several milliseconds. The electron spin resonance (ESR) may be excited by means of a continuous wave signal of microwave source 25 or, as known per se, by means of pulsed signals. One can also conduct experiments with adiabatic passage. The unpaired electrons which are magnetized accordingly are those which are present due to defects within the crystal lattice or due to impurities or offsets within the crystalline structure.

The magnetic field strength $B_{01}$ is typically between 0.01 and 0.2T. This corresponds to ESR resonance frequencies of between 250 MHz and 6 GHz. The power of the irradiated microwave is sufficient to saturate the electron spin system within the diamond. The magnetization of the electron system is then transferred to the spin system for enhancing nuclear magnetization.

This may be effected in two different ways:

A first possibility consists in exciting a preselected ESR transition within a strong rf field, the vector of the magnetic rf field being directed perpendicularly to the static magnetic field. The intensity of the microwave irradiation must be set such that the ESR line is saturated. The exact frequency then depends from the kind of cross-polarization. For diamonds, the frequency must be offset from the pure ESR frequency by the NMR Larmor frequency within the corresponding static magnetic field. The time during which the ESR transition is saturated depends as well from the spin-lattice relaxation time of electrons as well as from the relaxation time of the nuclei. In diamonds, a complete build-up of magnetization at moderate levels of irradiation may be achieved within less than one hour. However, even within a time of less than five minutes, the enhancement of magnetization may be such that very small particles may be detected.

A further possibility for shortening the build-up of magnetization consists in generating the magnetization effect not by static irradiation but by an appropriate pulse sequence instead. Such pulse sequences are known per se.

An appropriate pulse sequence is described in the article "Nuclear Spin Orientation via Electron Spin Locking (NOVEL)" of Henstra, A. et al., Journal of Magnetic Resonance, 77 pp. 389–393 (1988). Under the action of this pulse sequence, the electron magnetization is spin-locked with the RF magnetic field. If the spin-lock pulse amplitude complies with the modified Hartmann-Hahn condition, the electron system magnetization is transferred to the carbon spin system. This transfer is effected via flip-flop-terms describing the dipolar interaction between the nuclear spin system and the electron spin system.

If pulsed methods of cross-polarization are used, it is possible to work with substantially higher mass flow rates of sample material within a selection process, e.g. in a diamond mine, because the magnetization transfer is accelerated as described above. Further, the pulse sequences allow a great bandwidth of detection methods, because the spin system may be manipulated in any conceivable way. In such a way it is possible to compensate for the variation of the RF magnetic field within the sample as caused by absorption of the microwave field within the surrounding rock.

The measuring effect described before is dependent of a sufficient concentration of unpaired electrons within the diamond for allowing to excite a sufficient magnetization of the electron system. It is possible to increase the number of unpaired electrons artificially by temporarily generating defects within the crystal. When doing so, an electron is removed from its confined orbit so that for a sufficient period of time an unpaired electron is at disposal that may take part in the magnetization process without resulting in a permanent damage to the diamond.

Such a transitory generation of unpaired electrons can, e.g. be effected by exposing the sample to the above-mentioned ionizing irradiation, i.e. by exposing the sample for example to γ-radiation, a neutron beam, X-rays, or to ultraviolet light.

As an alternative for effecting a shortening of the build-up of magnetization, one may use a method according to which ultrasonic oscillations are excited within the diamond. This may be made additionally to the methods described above.

If ultrasonic oscillations are excited within the diamond, the diamond relaxation rate is dependent on the number of mechanisms available to produce conditions causing transitions between different energy levels. Application of ultrasound at the correct stimulating frequency to the sample increases the number of lattice phonons and, hence, increases the number of transitions between energy levels. This enables the equilibrium magnetization to be reached more rapidly.

The sample material so pre-treated within pre-treatment station is then conveyed into the operational area of analyzing station 13.

Analyzing station 13 comprises a further magnet system generating a magnetic field of field strength $B_{o2}$. The related magnet system is preferably a superconducting magnet generating a field strength in the order of 4.7T. The corresponding NMR measuring frequency for $^{13}C$ nuclei is approximately 50 MHz.

Due to the fact that the sample material had been within the operational range of the pre-treatment station 12 for a sufficient period of time by setting the residual time accordingly, the sample material is conveyed to the adjacent analyzing station 13 in a condition in which the diamond inclusions in the kimberlite are sufficiently magnetized so that a corresponding NMR-measurement may be made. Due to the time constants involved, a rapid transfer of sample material from the pre-treatment station 12 to analyzing station 13 is not necessary. Experiments have shown that time intervals of about 10 min are not detrimental, because the pre-polarization is not affected in an unacceptable way.

In order not to affect the pre-polarization during the transfer stations 12 and 13 at all, various additional measures may be taken.

First, one can design magnet systems within stations 12 and 13 such that a substantial fringe field is generated. If stations 12 and 13 are not too distant one from another, then the sample material will always stay within a certain residual magnetic field of, say, 5 to 10G being sufficient to preserve the prepolarization.

Second, one can surround the conveyor between stations 12 and 13 with a low-field magnet system, e.g. an elongate solenoid or permanent magnets distributed along the conveyor.

Third, if the sample material is conveyed in containers, e.g. in buckets, then one can attach permanent magnets to the containers.

The NMR-measurement within analyzing station 13 is essentially conventional. The sample material is arranged within the center of the magnetic field at the field strength $B_{o2}$ and is simultaneously exposed to electromagnetic RF frequency pulses in a conventional manner. The spin echo signals emitted from the sample material are received, processed, and transferred to computer 14.

Analyzing station 13 may, for example, comprise a standard commercial NMR spectrometer as is available under the name BRUKER DSX 200 SWB. This spectrometer comprises a superconducting magnet having a vertical bore of 15 cm diameter. With this magnet system, kimberlite fragments up to 7 cm maximum dimension may be investigated, either individually or as batches.

The fragments may freely fall from a terminal end of a conveyor belt into the magnet bore, preferably against the action of an air counterflow. In such a way, the fragments may be decelerated as on an air cushion or under the action of the air counterflow, may be measured and may then be received on a second conveyor belt arranged beneath the magnet.

When the samples are located within the center of the magnetic field of e.g. 4.7T, they are exposed to a pulsed RF magnetic field, namely by means of a transmitter coil surrounding the sample. The echo signals emitted from the sample and corresponding to the free induction decay within the sample are received by the same coil, are amplified, digitized, interleaved and fed to computer 14.

Computer 14 derives the spectrum within the frequency domain by using a transfer function, e.g. by using Fourier transformation. The frequency domain spectrum so derived is then investigated as to the occurrence of an absorption line being characteristic for $^{13}C$ in diamond. As an alternative or simultaneously, the echo signal may directly be analyzed within the time domain by using certain signal processing techniques, for example neuronal networks.

The NMR-measurement may be effected within a period of time of 1 ms so that the samples may be measured on an air cushion or at reduced falling speed, as described above. As an alternative, the loading and deloading time from the cylinder may be set very shortly in order to be able to set the repetition rate of subsequent measurements at a high level.

For operation within a diamond mine, a much bigger magnet system may be used having a free bore diameter in the order of 1 m. Depending on the respective conveyor system, the magnet bore may be directed vertically or horizontally. Such magnet systems having a horizontal bore are used, for example, for nuclear spin tomography, i.e. in a medical field of application of imaging NMR.

The NMR-measurement as such is made by irradiating a pulse sequence. A first 90° pulse flips the magnetization from the axial direction of the constant magnetic field into a plane of observation, perpendicular thereto. As the magnetization rapidly defocuses due to local inhomogeneities of the magnetic field, it is advisable to refocus the magnetization by means of appropriate pulses and to then detect same as so-called spin-echoes.

According to a preferred embodiment, so-called phase alternating 180° pulses are used as refocusing pulses, however, one can also use phase-shifted 90° pulses or simple 180° pulses. The NMR signal, entirely detected, amplified and digitized is then stored in a memory of computer 14 and complete echoes are summed-up in order to reduce the signal-to-noise ratio by averaging techniques.

If computer 14 detects that a $^{13}C$ signal occurs above a certain threshold value, sample separator element 15 is activated so that a certain sample quantity is picked out to diamond concentration bin 16 for then searching for the diamond therein.

If the installation operates with a continuous flow, e.g. a flow of sample material falling free into analyzing station 13, sample separator element 15 may, e.g. operate with a strong fluid stream, in particular an air stream. The flow of sample material exiting from analyzing station 13 is then deflected for a predetermined period of time such that a predetermined amount is directed to diamond concentration bin 16, as explained before.

As an alternative, one can operate non-continuously by processing the sample material in individual predetermined quantities.

Figure 4:
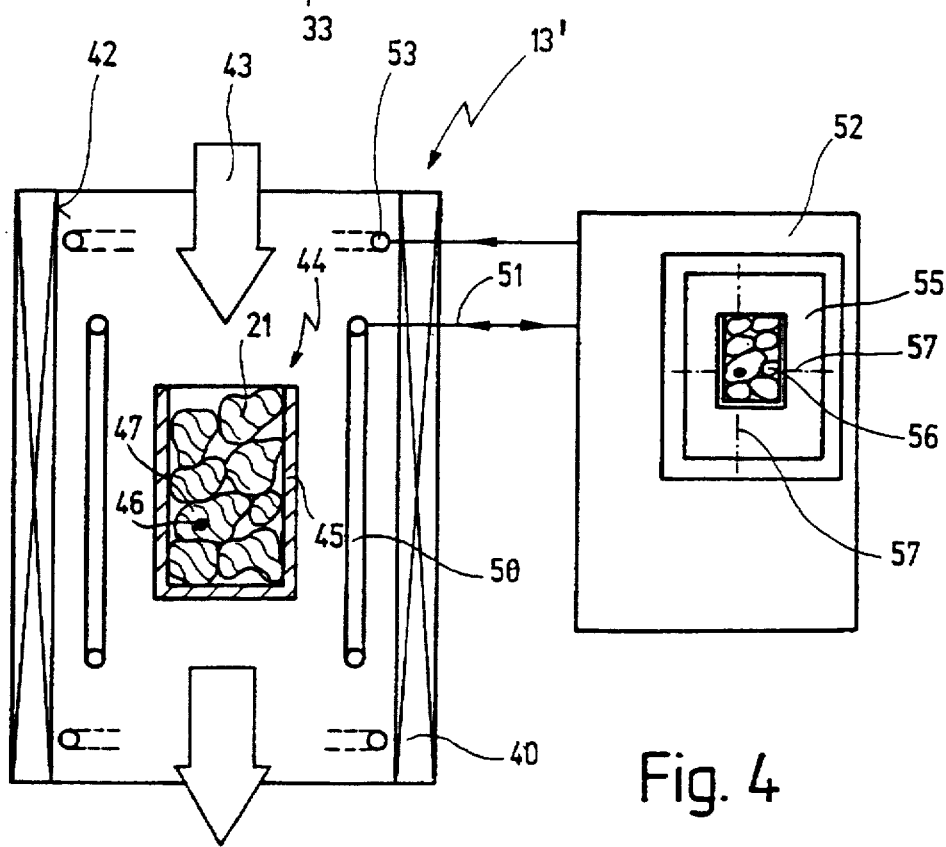
FIG. 4 shows a further embodiment of an apparatus and a process according to the invention for describing a discontinuous processing of sample material.

An example thereof is depicted in FIG. 4 for an alternate embodiment of analyzing station 13'.

Analyzing station 13' comprises a magnet coil 40, in particular a superconducting solenoid coil. Coil 40 has an axial bore 42. As indicated by arrows 43, individual sample containers 14 may be conveyed through bore 42 in an axial direction.

Sample container 44 has a wall 45 consisting of a magnetic inactive material being selected such that it does not give rise to spurious signals that might be disturbing the measurements of interest in the present context. For example, sample containers 44 made from polyvinylchloride (PVC) might be used. The sample containers 44 could have a volume of between 10 and 20 l if used within superconducting magnet systems as may be built today with a field strength in the order of 4T. Sample container 44 contains fragments 21. FIG. 4 shows in one of the fragments 21 that a diamond 46 is contained within surrounding rock 47, namely kimberlite.

Further, a transmitter/receiver coil 50 is arranged within bore 42 of magnet coil 40, the transmitter/receiver coil 50 being connected to a spectrometer console 52 via a line 51.

Finally, a system of gradient coils 53 is provided, as shown extremely schematically in FIG. 4. Gradient coil 53 allows to superimpose a field gradient, for example such that the magnetic field strength linearly decreases or increases, respectively, along direction 43 indicated by an arrow and symbolizing the direction of transport of sample containers 44 through bore 42. In such a case, one-dimensional NMR-measurements are possible, i.e. a statement may be made along the axial direction of magnet coil 40 at which axial position the NMR active substance is located.

For that purpose, spectrometer console 52 comprises a display 55 for generating an image of sample container 44 together with its contents. By superimposing one or more gradients to the magnetic field, coordinates 57 indicating the position of diamond 46 may be determined.

If after transition of magnet coil 40 the one probe container 44 in which diamond 46 was detected, is picked out, one can, therefore, not only make a statement that diamond 46 is contained within that sample container 44, instead, one can additionally make a statement at which axial position or at which multi-dimensional position diamond 46 is located within sample container 44.

It goes without saying that the field of application for detecting diamonds in kimberlite rocks, as explained in detail above, is to be understood only as an example. The invention may advantageously be used generally for the rapid measurement of samples having a very long spin-lattice relaxation time $T_1$ and, if the method is used for detecting certain substances, it is not restricted to diamonds. For example, it may also be used for any other kinds of crystals, preferably also for other kinds of gemstones, e.g. rubies or sapphires, where other kind of nuclei may be used, for example $^{27}$Al.

We claim:

1. A method for rapidly detecting a gemstone within a substance surrounding said gemstone, by means of nuclear magnetic resonance (NMR), said gemstone having a spin-lattice relaxation time $(T_1)$ of at least ten seconds and comprising a predetermined kind of nuclei, said predetermined kind of nuclei being absent from said surrounding substance, the method comprising the steps of:

conveying a flow of sample material including said gemstone and said surrounding substance through a pre-treatment station;

within said pre-treatment station exposing said flow of sample material to a first magnetic field $(B_{01})$ of a first predetermined field strength;

exposing said flow of sample material to electron spin resonance excitation at said first predetermined field strength for shortening the build-up of magnetization of said predetermined kind of nuclei; and during said step of exposing said flow of sample material to electron spin resonance, further exposing said flow of sample material to ionizing radiation for artificially increasing the number of unpaired electrons within said gemstone by temporarily generating defects within said gemstone, said ionizing radiation being set to not result in a permanent damage of said gemstone;

conveying said flow of sample material from said pre-treatment station through a transfer zone to an analyzing station, said flow of sample material, when being conveyed through said transfer zone, being exposed to a magnetic residual field, the magnetic residual field being smaller in field strength than said first magnetic field $(B_{01})$;

within said analyzing station;

exposing said flow of sample material to a second magnetic field $(B_{02})$ of a second predetermined field strength; and exposing said flow of sample material to nuclear magnetic resonance excitation at said second predetermined field strength and measuring a nuclear magnetic resonance signal from said predetermined first kind of nuclei;

evaluating said nuclear magnetic resonance signal; and removing a predetermined quantity of sample material from said flow of sample material upon occurrence of a predetermined nuclear magnetic resonance signal.

2. The method of claim 1, wherein said sample has a spin-lattice relaxation time $(T_1)$ in excess of one minute up to the order of hours.

3. The method of claim 1, wherein said sample comprises kimberlite rocks and diamonds embedded therein.

4. The method of claim 1 wherein said first and second magnetic fields have different field strengths.

5. The method of claim 4, wherein said second magnetic field strength is at least five times as big as said first magnetic field strength.

6. The method of claim 1, wherein said step of exposing said flow of sample material to electron spin resonance excitation comprises simultaneously exposing said gemstone and said surrounding substance to ultrasonic excitation.

7. The method of claim 1, wherein said predetermined kind of nuclei is $^{13}$C.

8. The method of claim 1, wherein said step of measuring said nuclear magnetic resonance signal comprises the step of measuring imaging signals.

9. The method of claim 1, wherein said flow of sample material is a continuous flow.

10. The method of claim 1, wherein said flow of sample material is a discontinuous flow.

11. The method of claim 1, wherein said ionizing radiation is γ radiation.

12. The method of claim 1, wherein said ionizing radiation is X-ray radiation.

13. An apparatus for fast detecting a gemstone within a surrounding substance, by means of nuclear magnetic resonance (NMR), said gemstone having a spin-lattice relaxation time ($T_1$) of at least ten seconds and comprising a predetermined kind of nuclei, said predetermined kind of nuclei being absent from said surrounding substance, the apparatus comprising:

means for conveying a flow of sample material including said gemstone and said surrounding substance through a pre-treatment station;

means for exposing said flow of sample material within said pre-treatment station to a first magnetic field ($B_{01}$) of a first predetermined field strength;

means for exposing said flow of sample material within said pre-treatment station to electron spin resonance excitation at said first predetermined field strength for shortening the build-up of magnetization of said predetermined kind of nuclei; and means for further exposing said flow of sample material to ionizing radiation during exposing said flow of sample material to electron spin resonance excitation, for artificially increasing the number of unpaired electrons within said gemstone by temporarily generating defects within said gemstone, said ionizing radiation being set to not result in a permanent damage of said gemstone;

means for conveying said flow of sample material from said pre-treatment station through a transfer zone to an analyzing station, said flow of sample material, when conveyed through said transfer zone, being exposed to a residual magnetic field, said residual magnetic field being smaller in field strength than said first magnetic field ($B_{01}$);

means for exposing said flow of sample material to a second magnetic field ($B_{02}$) of a second predetermined field strength;

means for exposing said flow of sample material to nuclear magnetic resonance excitation at said second predetermined field strength and measuring a nuclear magnetic resonance signal from said predetermined first kind of nuclei;

means for evaluating said nuclear magnetic resonance signal; and means for removing a predetermined quantity of sample material from said flow of sample material upon occurrence of a predetermined nuclear magnetic resonance signal.

14. The apparatus of claim 13, wherein said first and said second magnetic fields have different field strength.

15. The apparatus of claim 13, wherein said second magnetic field strength is at least five times as big as said first magnetic field strength.

16. The apparatus of claim 13, wherein said means for exposing said flow of sample material within said pre-treatment station to electron spin resonance excitation comprises means for simultaneously exposing said gemstone and said surrounding substance to ultrasonic excitation.

17. The apparatus of claim 13, wherein said predetermined kind of nuclei is $C^{13}$.

18. The apparatus of claim 13, wherein said conveying means comprises recycling means for repeatedly conveying said removed sample material through said pre-treatment station, said transfer zone and said analyzing station.

19. The apparatus of claim 13, wherein said flow of sample material is a continuous flow.

20. The apparatus of claim 13, wherein said flow of sample material is a discontinuous flow.

21. The apparatus of claim 13, wherein said ionizing radiation is γ radiation.

22. The method of claim 13, wherein said ionizing radiation is x-ray radiation.

* * * * *